United States Patent
Hsu et al.

(10) Patent No.: US 6,580,658 B1
(45) Date of Patent: Jun. 17, 2003

(54) METHOD USING A WORD LINE DRIVER FOR DRIVING A WORD LINE

(75) Inventors: Yu-Ming Hsu, Hsin-Chu (TW); Yen-Tai Lin, Hsin-Chu (TW); Chien-Hung Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/065,661

(22) Filed: Nov. 7, 2002

(51) Int. Cl.$^7$ ................................................. G11C 8/00
(52) U.S. Cl. ............................... 365/230.06; 365/185.23
(58) Field of Search ...................... 365/230.06, 189.11, 365/185.23

(56) References Cited

U.S. PATENT DOCUMENTS

| | | | | |
|---|---|---|---|---|
| 5,602,796 A | * | 2/1997 | Sugio | ................... 365/230.06 |
| 6,104,665 A | * | 8/2000 | Hung et al. | ............. 365/230.06 |
| 6,370,063 B2 | * | 4/2002 | Kim | ....................... 365/185.23 |
| 6,535,430 | * | 3/2003 | Oruga et al. | ........... 365/185.23 |

* cited by examiner

Primary Examiner—Tan T. Nguyen
(74) Attorney, Agent, or Firm—Winston Hsu

(57) ABSTRACT

A word line driver includes an address decoder having a first circuit and a second circuit for selecting the word line, and a control end disposed between the first circuit and the second circuit. In addition, the word line driver has a level shift circuit for shifting a voltage level of the word line, and the level shift circuit has an input end connected to the second circuit of the address decoder. A method of driving a word line includes shifting a voltage level of the control end while turning on the second circuit so as to shift a voltage level of the input end of the level shift circuit, and shifting a voltage level of at least one of the first and second power supplies and using the second circuit to isolate the voltage level of the control end from the voltage level of the word line.

14 Claims, 8 Drawing Sheets

METHOD USING A WORD LINE DRIVER FOR DRIVING A WORD LINE

BACKGROUND OF INVENTION

1. Field of the Invention

The present invention relates to a method for driving a word line, and more particularly, to a method using a word line driver for driving a word line.

2. Description of the Prior Art

Flash memory is a non-volatile memory device. It has a floating gate for storing electric charges and a control gate for controlling the amount of charges stored in the floating gate. Please refer to FIG. 1 and FIG. 2. FIG. 1 is a functional diagram of a word line driver 10 according to the prior art. FIG. 2 is a simplified diagram of the word line driver 10 shown in FIG. 1. The word line driver 10 is used for driving voltages to a word line 16. This word line 16 can be connected to control gates in devices such as flash memory so that the word line driver 10 can program or erase the flash memory.

The word line driver 10 comprises an address decoder 12, an isolating transistor N1, and a level shift circuit 14. The isolating transistor N1 is electrically connected between the address decoder 12 and the level shift circuit 14 for isolating the address decoder 12 from the level shift circuit 14. The level shift circuit 14 is electrically connected to the word line 16 for transmitting voltage signals to the word line 16.

For the following explanation, 3V will represent a logical "1" and 0V will represent a logical "0" for normal operation. In order to program or erase the flash memory through the word line, however, different voltages need to be used. All voltages are supplied by positive and negative word line power sources WLP and WLN. When the flash memory is not being programmed or erased, WLP=3V and WLN=0V. However, in order to erase a flash memory cell, a positive high voltage value of 10V must be fed to the memory cell. Thus, during an erasing operation, WLP=10V and WLN=0V. On the other hand, when programming the flash memory cell, a negative high voltage value -10V must be fed to the memory cell. Thus, WLP=3V and WLN=-10V during a programming operation. These voltage values are used for simplicity in explanation, and can be changed according to specifications of the flash memory.

The address decoder 12 is used for selecting specific memory cells to program or erase. When a particular memory cell is selected to be programmed, the address decoder 12 outputs a value of 3V to the word line driver 10 corresponding to that memory cell. A gate 18 of isolating transistor N1 is controlled to close the isolating transistor N1, and allow the 3V value to pass through. This 3V value then icloses transistor MN1, and allows the word line 16 to receive the voltage of WLN. Simultaneously, the negative word line power source is changed so that WLN=-10V. As a result, the word line 16 receives a voltage value of 10V, and is programmed properly.

An erasing operation of the word line driver works in a similar manner. To indicate that a memory cell is to be erased, the address decoder 12 outputs a value of 0V to the word line driver 10 corresponding to that memory cell. Again, the gate 18 of isolating transistor N1 is controlled to close the isolating transistor N1, and allow the 0V value to pass through. This 0V value then closes transistor MP1, and allows the word line 16 to receive the voltage of WLP. Simultaneously, the positive word line power source is changed so that WLP=10V. As a result, the word line 16 receives a voltage value of 10V, and is erased properly.

The positive and negative word line power sources WLP and WLN are connected to many memory cells. A potential problem occurs when the value of WLP or WLN is forced to switch from regular voltage values to positive or negative high voltage values. In the programming example explained above, when the negative word line power source is switched such that WLN=-10V, this power is fed to all memory cells connected to WLN, not just the memory cell being programmed. This could cause switched voltage values to travel through the level shift circuit 14 and introduce incompatible voltage values to address decoder 12 pins corresponding to memory cells that are not being programmed. Because these incompatible voltage values could cause damage to the address decoder 12, the isolating transistor N1 is used to protect the address decoder 12. Each memory cell has one isolating transistor N1 that is selectively opened or closed in order to let voltage values pass through. Each isolating transistor N1 is independently controlled by voltage values applied to the gate 18 of the isolating transistors N1.

Unfortunately, using an isolating transistor N1 for each memory cell adds up to an enormous amount of isolating transistors used for a large array of memory cells. The use of the isolating transistor N1 complicates circuit layout of the memory, and further leads to a more complex manufacturing process.

SUMMARY OF INVENTION

It is therefore a primary objective of the claimed invention to provide a method of using a word line driver for driving a word line, in which the word line driver does not use an isolating transistor, to solve the above-mentioned problems.

According to the claimed invention, a word line driver includes a first address decoder having a first circuit and a second circuit for selecting the word line, and a control end disposed between the first circuit and the second circuit. In addition, the word line driver has a level shift circuit connected between a first power supply, a second power supply, the first address decoder and the word line for shifting a voltage level of the word line, and the level shift circuit has an input end connected to the second circuit of the first address decoder. A method of using the word line driver for driving a word line includes shifting a voltage level of the control end while turning on the second circuit so as to shift a voltage level of the input end of the level shift circuit, and shifting a voltage level of at least one of the first and second power supplies and using the second circuit to isolate the voltage level of the control end from the voltage level of the word line.

It is an advantage of the claimed invention that the second circuit is able to isolate the voltage level of the control end from the voltage level of the word line without using a dedicated isolating transistor. This reduces manufacturing complexity, and leads to lower costs for memory production.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 3:
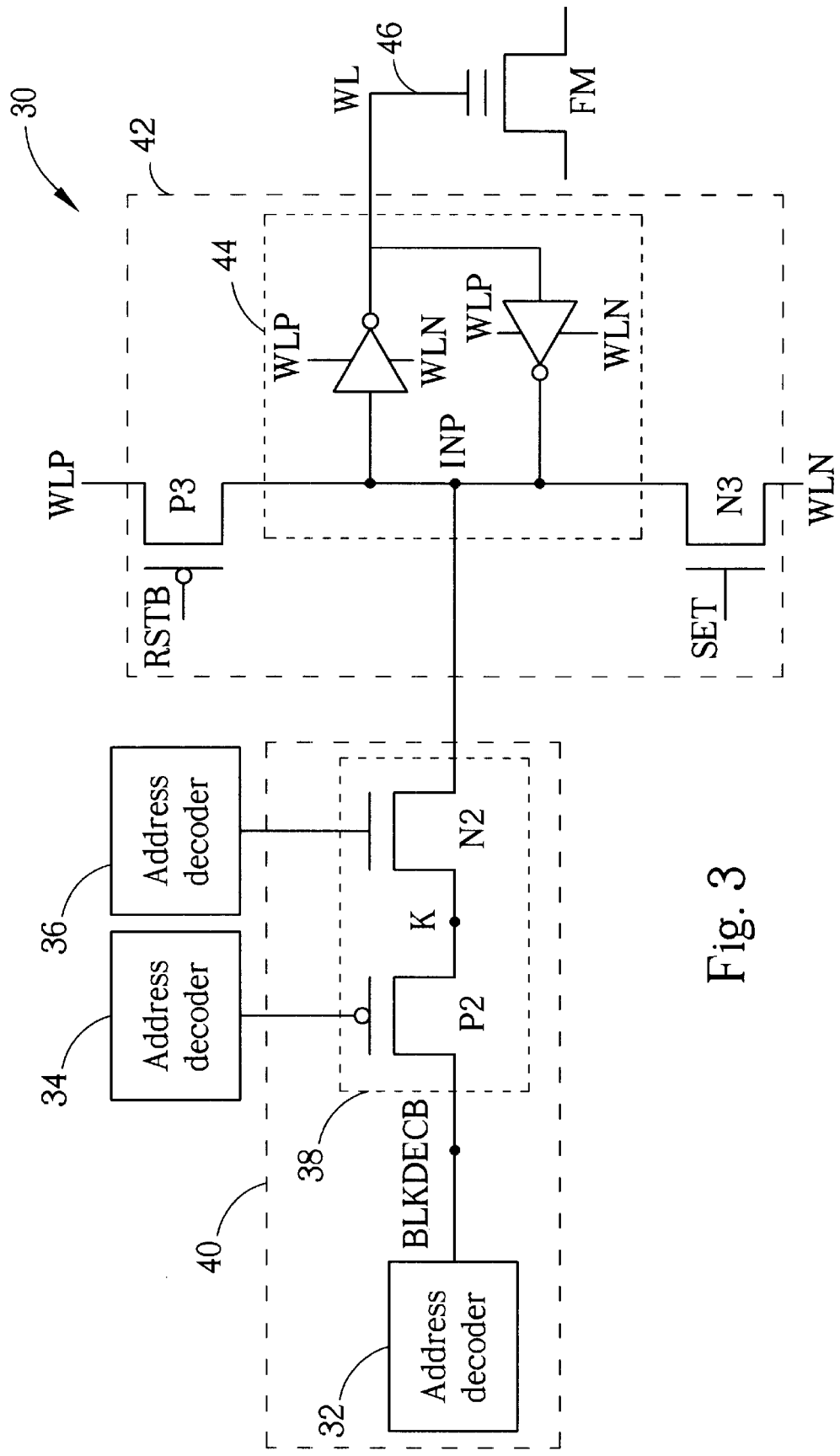
FIG. 3 is a functional diagram of a word line driver according to a first embodiment of the present invention.

Please refer to FIG. 3. FIG. 3 is a functional diagram of a word line driver 30 according to a first embodiment of the present invention. The word line driver 30 comprises a first address decoder 40 with a first circuit 32 and a second circuit 38 that are used for selecting a word line WL. The second circuit 38 includes a PMOS transistor P2 and an NMOS transistor N2. The PMOS transistor P2 is connected to a second address decoder 34, and the NMOS transistor N2 is connected to a third address decoder 36.

The word line driver 30 further comprises a level shift circuit 42 connected between a first power supply WLP, a second power supply WLN, the first address decoder 40, and the word line WL for shifting a voltage level of the word line WL. This voltage level is shifted in order for the word line driver 30 to perform programming and erasing operations on a flash memory cell FM. The word line WL is connected to a control gate 46 of the flash memory cell FM, and the word line driver 30 is what controls the word line WL to program or erase the flash memory cell FM.

The level shift circuit 42 has an input end INP connected to the second circuit 38 of the first address decoder 40. The level shift circuit 42 also includes a latch 44 connected between the input end INP of the level shift circuit 42 and the word line WL. This latch 44 contains two inverters, which serve to invert voltage levels that are inputted to the latch 44. The level shift circuit 42 further comprises a PMOS transistor P3 connected between the first power supply WLP and the input end INP of the latch 44, and an NMOS transistor N3 connected between the second power supply WLN and the input end INP of the latch 44.

The first address decoder 40 also has a control end BLKDECB located between the first circuit 32 and the second circuit 38. In order for the word line driver 30 to drive the word line WL, first a voltage level of the control end BLKDECB is shifted while turning on the second circuit 38 so as to shift a voltage level of the input end INP of the level shift circuit 42. In addition, a voltage level of one or both of the first and second power supplies WLP and WLN is shifted, and the second circuit 38 is used to isolate the voltage level of the control end BLKDECB from the voltage level of the word line WL. A detailed explanation of this voltage isolation will be given below.

Whenever the voltage level at the input end INP of the level shift circuit 42 is changed, the latch 44 is used to change the voltage level of the word line WL. This is accomplished by switching on either the PMOS transistor P3 or the NMOS transistor N3 to electrically connect the input end INP of the latch 44 to either the first power supply WLP or the second power supply WLN.

To more clearly illustrate the present invention, examples of programming and erasing operations will be explained.

For simplicity, the same example voltages used in the description of the prior art will be used in the explanation of the present invention. That is, when the flash memory is not being programmed or erased, WLP=3V and WLN=0V. In order to erase the flash memory cell FM, a positive high voltage value of 10V must be fed to the memory cell FM. Thus, during an erasing operation, WLP=10V and WLN=0V. On the other hand, when programming the flash memory cell, a negative high voltage value −10V must be fed to the memory cell FM.

Thus, WLP=3V and WLN=−10V during a programming operation.

To initiate an erasing procedure, a low-active reset signal RSTB is given the value RSTB=0V for a predetermined amount of time, which will give the input end INP a value of 3V. At this time, the value of RSTB can be switched back to 3V to isolate the input end INP from the first power supply WLP. Then, to select the memory cell FM for erasing, a logical "0" is outputted from the first circuit 32, and the control end BLKDECB=0V. Further, the second address decoder 34 will output 0V, and the third address decoder 36 will output 3V or above to allow the 0V value at the control end BLKDECB to be transmitted to the input end INP of the latch 44. On the other hand, for memory cells that are not selected for erasing, a logical "1" is outputted from the first circuit 32, the control end BLKDECB=3V, and the input end INP of the latch 44 will remain 3V.

Similarly, to initiate a programming procedure, a high-active set signal SET is given the value SET=3V for a predetermined amount of time, which will give the input end INP a value of 0V. At this time, the value of SET can be switched back to 0V to isolate the input end INP from the second power supply WLN. Then, to select the memory cell FM for programming, a logical "1" is outputted from the first circuit 32, and the control end BLKDECB=3V. Further, the second address decoder 34 will output 0V, and the third address decoder 36 will output 3V or above to allow the 3V value at the control end BLKDECB to be transmitted to the input end INP of the latch 44. On the other hand, for memory cells that are not selected for programming, the input end INP of the latch 44 will remain 0V. The input end INP of the latch 44 will have the value of 0V when one of the following conditions is met. The first condition is that the first circuit 32 outputs a value of 0V. The second condition is that the output of the second address decoder 34 is at a high voltage to switch off the PMOS transistor P2. The third condition is that the output of the third address decoder 36 is at a low voltage to switch off the NMOS transistor N2.

Figure 4:
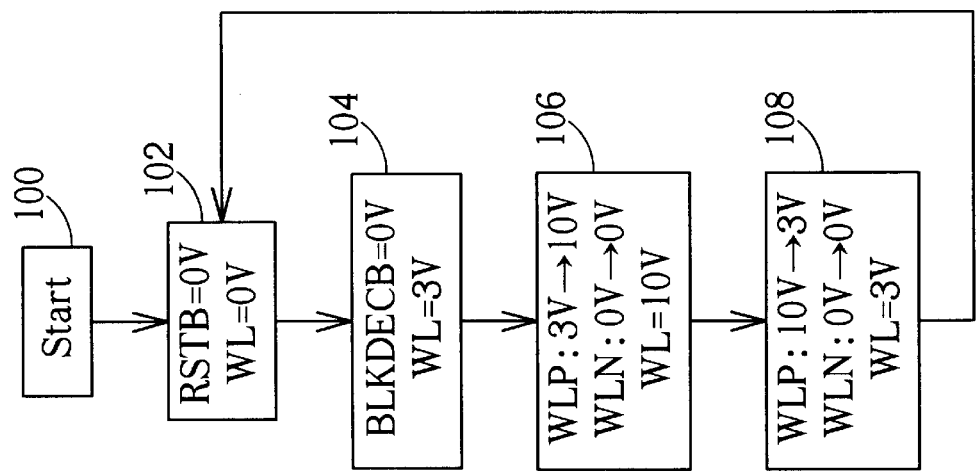
FIG. 4 is a flowchart illustrating steps used in erasing a flash memory cell according to the present invention.

Please refer to FIG. 4. FIG. 4 is a flowchart illustrating steps used in erasing the flash memory cell FM.

Step 100:Start;

Step 102:

Begin the process of erasing the flash memory cell FM with a low-active reset signal RSTB=0V. At this time, the voltage level of the input end INP of the level shift circuit 42 will increase to 3V, the voltage level of the first power supply WLP. And the word line voltage will become 0V;

Step 104:

The first circuit 32 of the first address decoder 40 begins a normal decoding procedure. Since this is an erasing process, a logical "0" is outputted from the first circuit 32, and the control end BLKDECB=0V. The second address decoder 34 outputs 0V, and the third address decoder 36 outputs 3V or above to allow the 0V value at the control end BLKDECB to be transmitted to the input end INP of the latch 44. The latch 44 then inverts the 0V value, making the word line WL=3V;

Step 106:
The level shift circuit 42 shifts the value of the first power supply WLP from 3V to 10V. During this time, the value of the second power supply WLN is held steady at 0V. As a result of the voltage shift, the word line WL=10V. This erases the flash memory cell FM; and Step 108:
Operating voltages are restored to initial states. That is, the level shift circuit 42 shifts the value of the first power supply WLP from 10V back to 3V. Also, the value of the second power supply WLN is again held steady at 0V. As a result of the voltage shift, the word line WL=3V. Go back to step 102.

Figure 5:
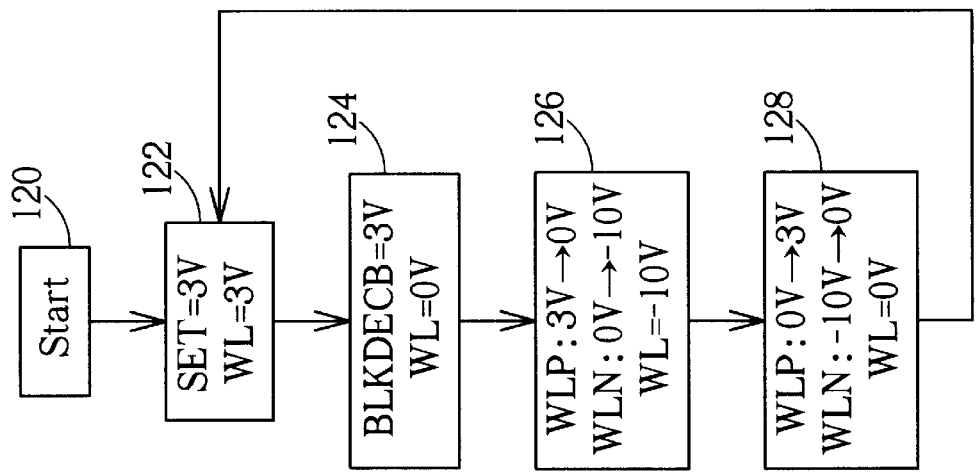
FIG. 5 is a flowchart illustrating steps used in programming the flash memory cell according to the present invention.

Please refer to FIG. 5. FIG. 5 is a flowchart illustrating steps used in programming the flash memory cell FM.

Step 120:Start;

Step 122:
Begin the process of programming the flash memory cell FM with a high-active set signal SET=3V. At this time, the voltage level of the input end INP of the level shift circuit 42 will decrease to 0V, the voltage level of the second power supply WLN. And the word line voltage will become 3V;

Step 124:The first circuit 32 of the first address decoder 40 begins a normal decoding procedure. Since this is a programming process, a logical "1" is outputted from the first circuit 32, and the control end BLKDECB=3V. The second address decoder 34 outputs 0V, and the third address decoder 36 outputs 3V or above to allow the 3V value at the control end BLKDECB to be transmitted to the input end INP of the latch 44. This allows the 3V value at the control end BLKDECB to reach the input end INP. The latch 44 then inverts the 3V value, making the word line WL=0V;

Step 126:
The level shift circuit 42 shifts the value of the first power supply WLP from 3V to 0V. At the same time, the value of the second power supply WLN is shifted from 0V to 10V. As a result of the voltage shift, the word line WL=−10V. This programs the flash memory cell FM; and Step 128:
Operating voltages are restored to initial states. That is, the level shift circuit 42 shifts the value of the first power supply WLP from 0V back to 3V. Also, the value of the second power supply WLN is shifted from 10V back to 0V. As a result of the voltage shift, the word line WL=0V. Go back to step 122.

To effectively protect the first circuit 32, the PMOS transistor P2 and the NMOS transistor N2 of the second circuit 38 are used to isolate the voltage level of the control end BLKDECB from the voltage level of the input end INP. As an example, assume a 0V value is applied to a gate of the PMOS transistor P2 and a 3V value or above is applied to a gate of the NMOS transistor N2. Applying these voltage values to the gates of the transistors P2 and N2 effectively protects the first circuit 32 from being damaged by the positive and negative high voltages that are used in the level shift circuit 42.

For instance, suppose that the input end INP has a value of 10V. In this case, since the gate of the NMOS transistor N2 has a value of 3V or above, the 10V value would be able to pass through the NMOS transistor N2 to node K. However, since the gate of the PMOS transistor P2 has a value of 0V, the 10V value would not be able to pass through the PMOS transistor P2 to the control end BLKDECB. Likewise, suppose that the input end INP has a value of 10V. In this case, since the gate of the NMOS transistor N2 has a value of 3V or above, the 10V value would not be able to pass through the NMOS transistor N2 to node K. Thus, in each scenario, the first circuit 32 is protected from being damaged by the positive and negative high voltages that are used in the level shift circuit 42. Furthermore, while protecting from positive and negative high voltages, the PMOS transistor P2 and the NMOS transistor N2 can also allow normal voltages of 0V and 3V to pass through.

Figure 6:
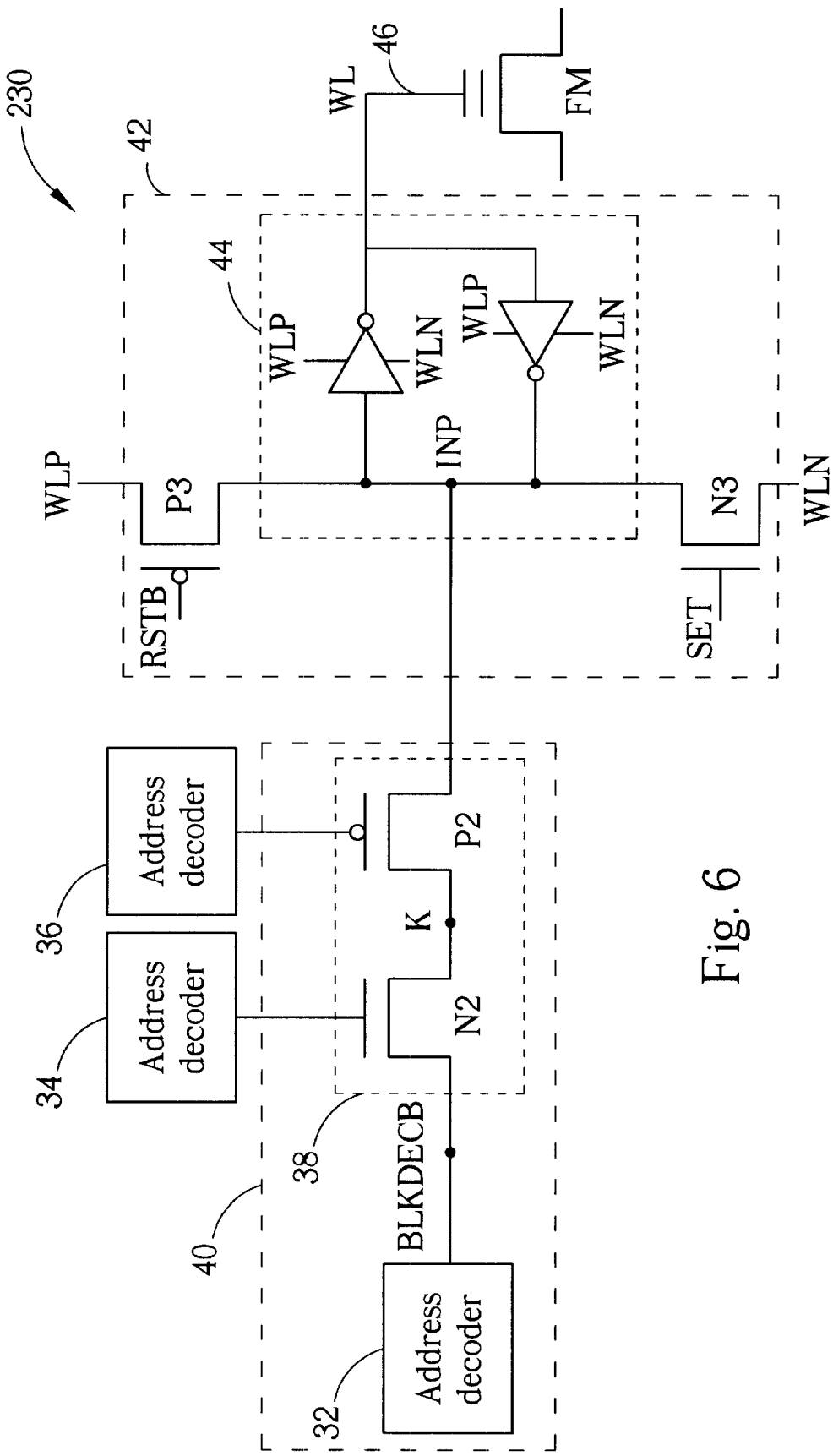
FIG. 6 through FIG. 9 are functional diagrams of word line drivers according to second through fifth embodiments of the present invention, respectively.

Besides the word line driver 30 shown in FIG. 3, other variations of the word line driver 30 can be used in the present invention. Please refer to FIG. 6. FIG. 6 is a functional diagram of a word line driver 230 according to a second embodiment of the present invention. The word line driver 230 is similar to the word line driver 30 shown in FIG. 3. The only difference is that the positions of the PMOS transistor P2 and the NMOS transistor N2 in the second circuit 38 have been switched. In the word line driver 230, the NMOS transistor N2 is connected to the second address decoder 34 and the PMOS transistor P2 connected to the third address decoder 36.

Figure 7:
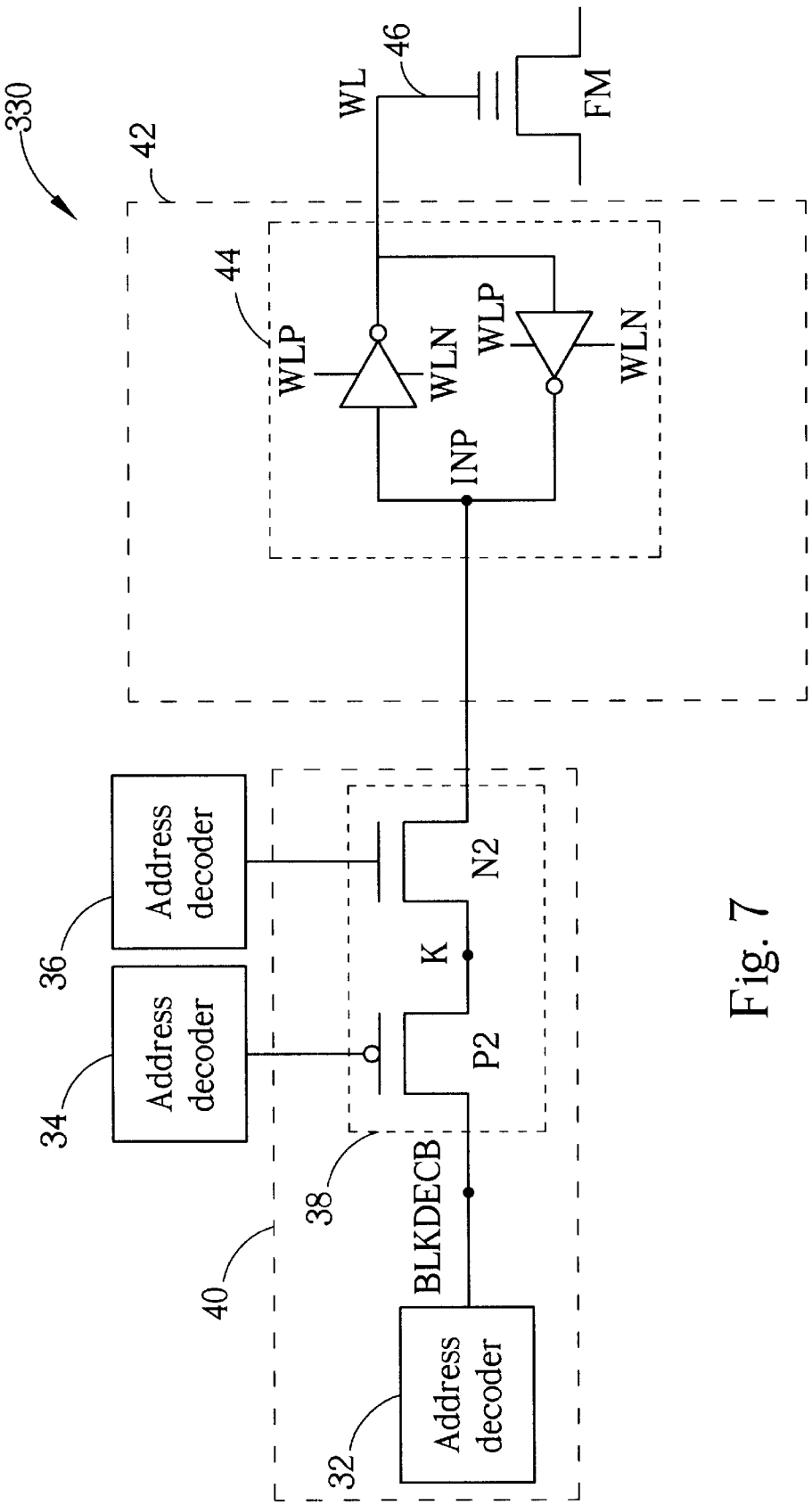

Another variation is shown in FIG. 7. FIG. 7 is a functional diagram of a word line driver 330 according to a third embodiment of the present invention. The word line driver 330 is similar to the word line driver 30 shown in FIG. 3. The only difference is that the word line driver 330 does not contain the PMOS transistor P3 and NMOS transistor N3 of the level shift circuit 42. Instead of using the low-active reset signal RSTB to control the PMOS transistor P3 and the high-active set signal SET to control the NMOS transistor N3, the first circuit 32 of the word line driver 330 can perform the same function of both of these transistors internally, reducing the complexity of the word line driver 330.

Figure 8:
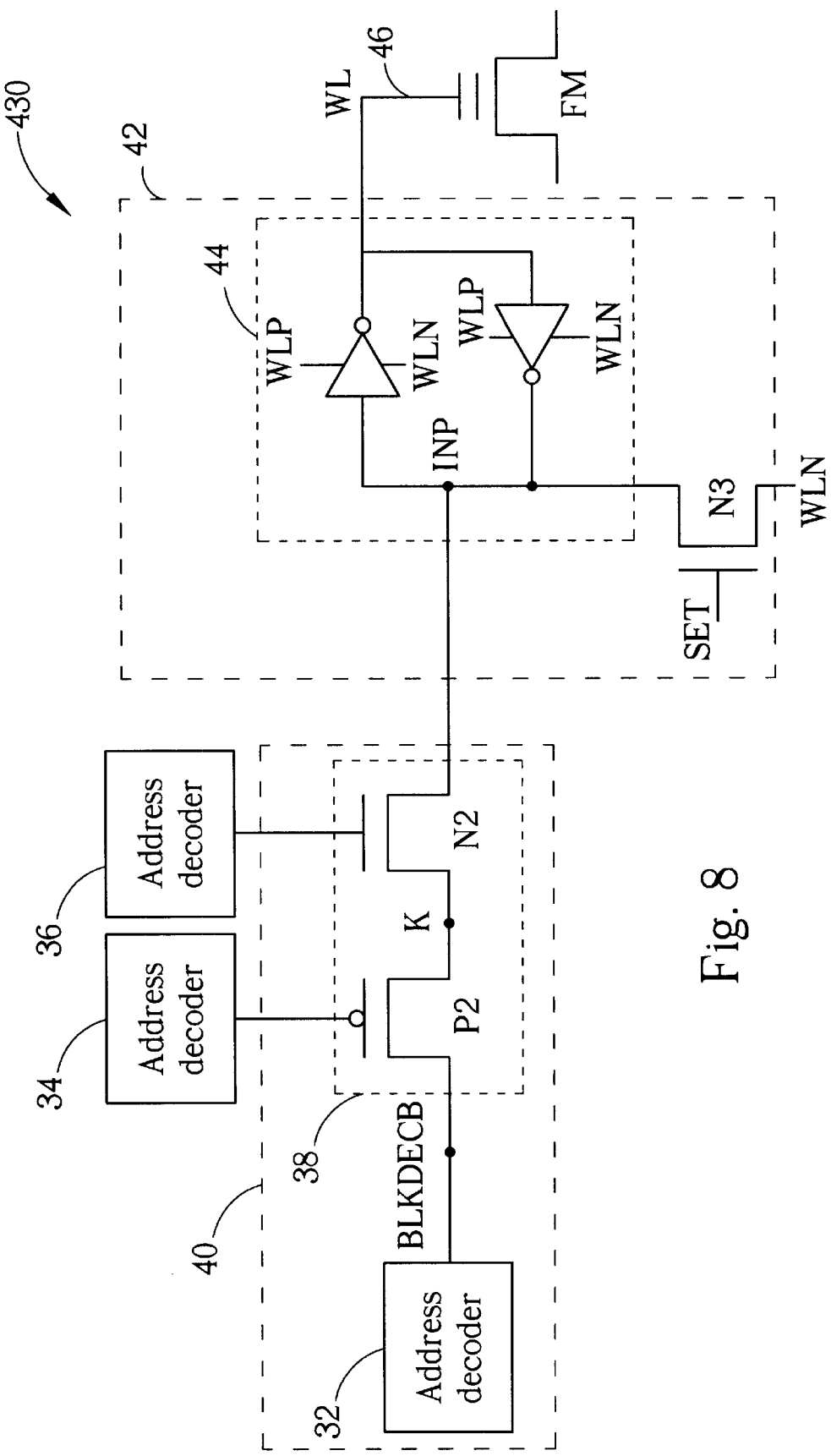

Please refer to FIG. 8. FIG. 8 is a functional diagram of a word line driver 430 according to a fourth embodiment of the present invention. The word line driver 430 is similar to the word line driver 30 shown in FIG. 3. The only difference is that the word line driver 430 does not contain the PMOS transistor P3 of the level shift circuit 42. Instead of using the low-active reset signal RSTB to control the PMOS transistor P3, the first circuit 32 of the word line driver 430 can perform the same function of the PMOS transistor P3 internally, reducing the complexity of the word line driver 430.

Figure 9:
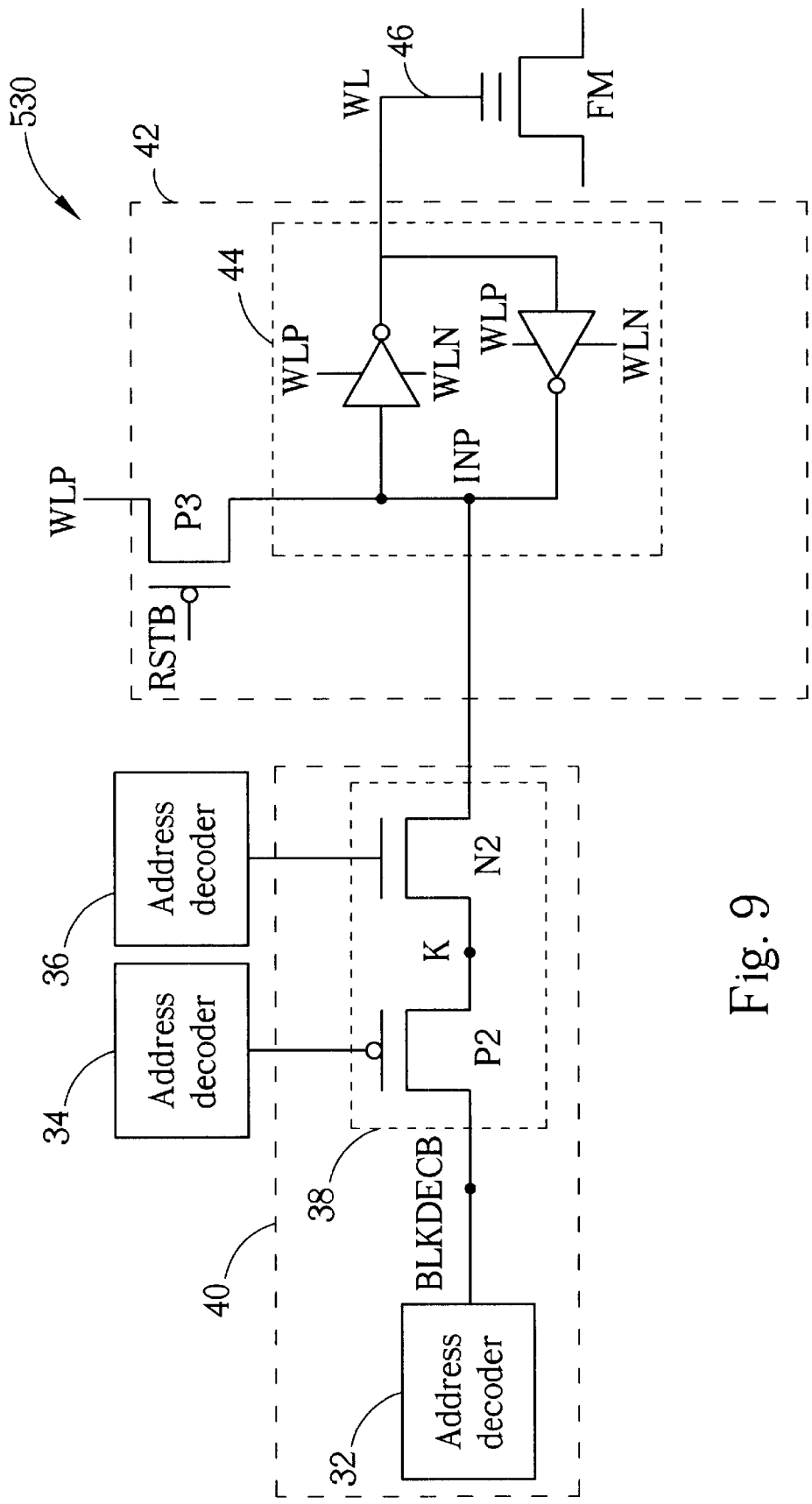

Another variation is shown in FIG. 9. FIG. 9 is a functional diagram of a word line driver 530 according to a fifth embodiment of the present invention. The word line driver 530 is similar to the word line driver 30 shown in FIG. 3. The only difference is that the word line driver 530 does not contain the NMOS transistor N3 of the level shift circuit 42. Instead of using the high-active set signal SET to control the NMOS transistor N3, the first circuit 32 of the word line driver 530 can perform the same function of both of these transistors internally, reducing the complexity of the word line driver 530.

Compared to the prior art, the present invention word line drivers 30, 230, 330, 430, and 530 do not require the use of the isolating transistor N1 that was used in the word line driver 10 of the prior art. Instead, the present invention word line drivers 30, 230, 330, 430, and 530 use the outputs of the second address decoder 34 and the third address decoder 36 to perform the same function as the isolating transistor N1. Moreover, the first address decoder 40, the second address decoder 34, and the third address decoder 36 shown in FIG.

Figure 1:
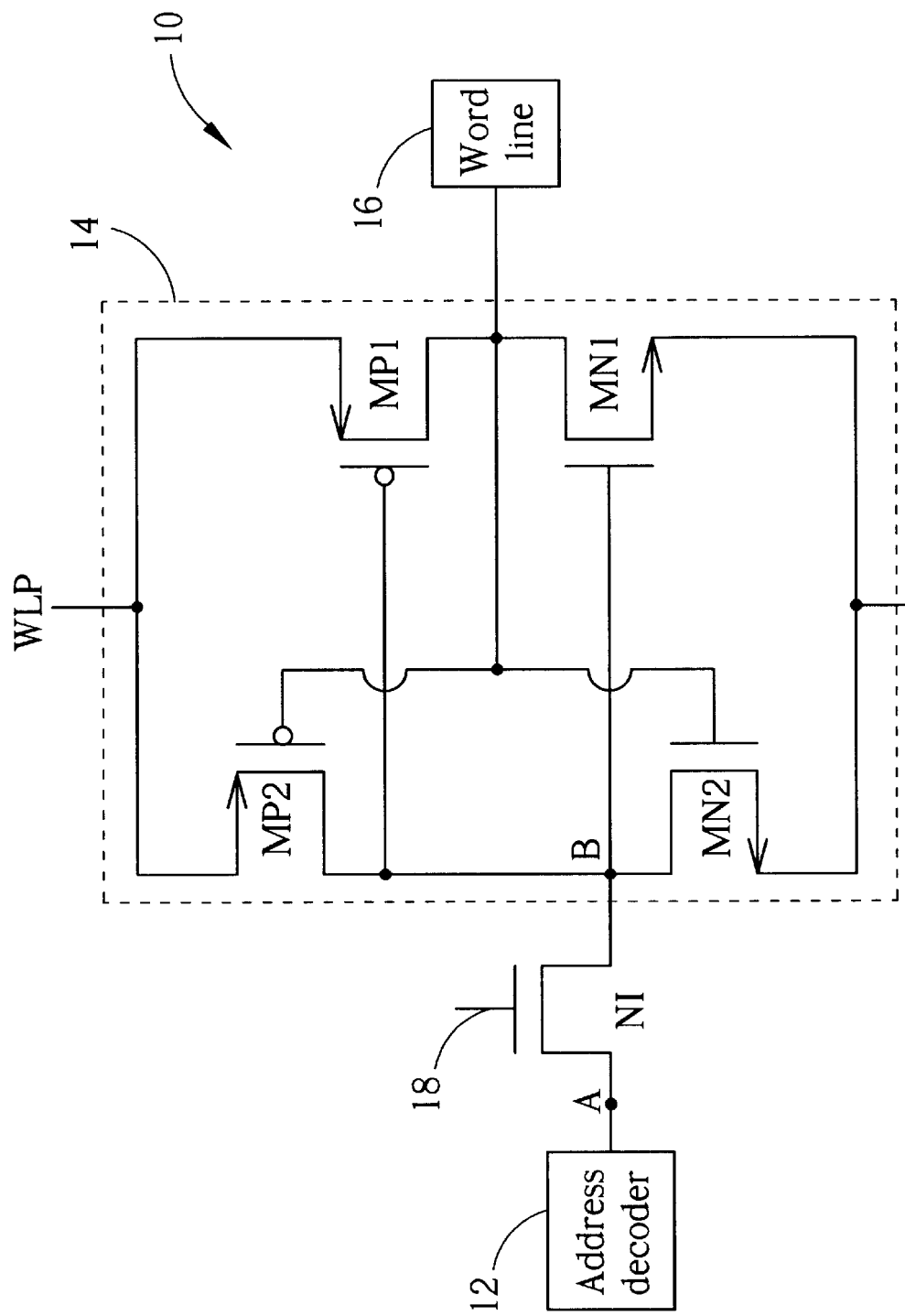
FIG. 1 is a functional diagram of a word line driver according to the prior art.
Figure 2:
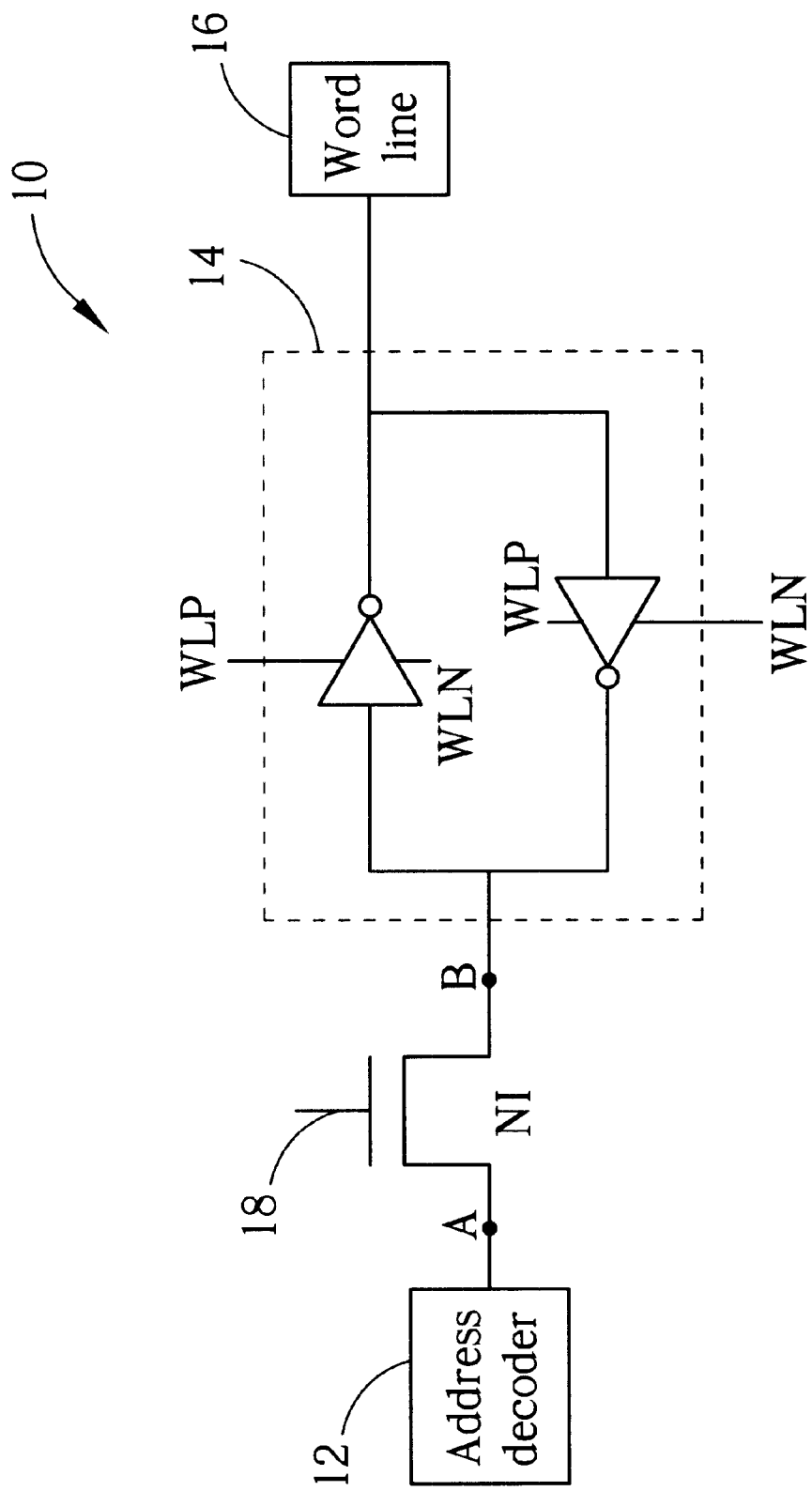
FIG. 2 is a simplified diagram of the word line driver shown in FIG. 1.

3 and FIG. 6 through FIG. 9 are all analogous to the address decoder 12 shown in FIG. 1 and FIG. 2. In other words, the address decoders 34, 36, and 40 of the present invention replace both the address decoder 12 and the isolating transistor N1 of the prior art without using any additional circuitry. This is accomplished by using outputs of the second address decoder 34 and the third address decoder 36 to selectively open and close the PMOS transistor P2 and the NMOS transistor N2, respectively, in order to isolate the voltage level of the control end BLKDECB from the voltage level of the word line WL.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method using a word line driver for driving a word line, the word line driver comprising:

a first address decoder having a first circuit and a second circuit for selecting the word line, and a control end disposed between the first circuit and the second circuit; and a level shift circuit connected between a first power supply, a second power supply, the first address decoder, and the word line for shifting a voltage level of the word line, the level shift circuit having an input end connected to the second circuit of the first address decoder;

the method comprising following steps:

(a) shifting a voltage level of the control end while turning on the second circuit so as to shift a voltage level of the input end of the level shift circuit; and (b) shifting a voltage level of at least one of the first and second power supplies and using the second circuit to isolate the voltage level of the control end from the voltage level of the word line.

2. The method of claim 1 wherein voltage levels of both first and second power supplies are shifted in step (b).

3. The method of claim 2 wherein the level shift circuit further comprises a latch connected between the input end of the level shift circuit and the word line, the method further comprising a following step:

(c) using the latch to change the voltage level of the word line when the voltage level at the input end of the level shift circuit is changed.

4. The method of claim 3 wherein the latch comprises a plurality of inverters.

5. The method of claim 3 wherein the level shift circuit further comprises a p-type transistor connected between the first power supply and the input end of the latch, and an n-type transistor connected between the second power supply and the input end of the latch, the method further comprising a following step:

(d) switching one of the p-type and n-type transistors to electrically connect the input end of the latch to one of the first and second power supplies.

6. The method of claim 5 wherein the p-type transistor is a PMOS, the n-type transistor being an NMOS.

7. The method of claim 3 wherein the level shift circuit further comprises a p-type transistor connected between the first power supply and the input end of the latch, the method further comprising a following step:

(d) switching the p-type transistor to electrically connect the input end of the latch to the first power supply.

8. The method of claim 7 wherein the p-type transistor is a PMOS.

9. The method of claim 3 wherein the level shift circuit further comprises an n-type transistor connected between the second power supply and the input end of the latch, the method further comprising a following step:

(d) switching the n-type transistor to electrically connect the input end of the latch to the second power supply.

10. The method of claim 9 wherein the n-type transistor is an NMOS.

11. The method of claim 1 wherein the word line is connected to a control gate of a flash memory cell, the method being used to program and erase the flash memory cell.

12. The method of claim 1 wherein the second circuit of the first address decoder comprises a p-type transistor and an n-type transistor.

13. The method of claim 12 wherein the p-type transistor is a PMOS, the n-type transistor being an NMOS.

14. The method of claim 12 wherein the p-type transistor is connected to a second address decoder, the n-type transistor being connected to a third address decoder.

* * * * *